Dec. 6, 1966 DAWON KAHNG ETAL 3,290,127

BARRIER DIODE WITH METAL CONTACT AND METHOD OF MAKING

Filed March 30, 1964 2 Sheets-Sheet 1

INVENTORS: D. KAHNG
M. P. LEPSELTER
BY [signature]
ATTORNEY

Dec. 6, 1966 DAWON KAHNG ETAL 3,290,127

BARRIER DIODE WITH METAL CONTACT AND METHOD OF MAKING

Filed March 30, 1964 2 Sheets-Sheet 2

3,290,127
BARRIER DIODE WITH METAL CONTACT AND METHOD OF MAKING

Dawon Kahng, Somerville, and Martin P. Lepselter, Franklin Park, N.J., assignors to Bell Telephone Laboratories, Incorporated, New York, N.Y., a corporation of New York Filed Mar. 30, 1964, Ser. No. 355,663
11 Claims. (Cl. 29—195)

This invention relates to semiconductor diodes of the surface barrier junction type and particularly to a surface barrier diode having a self-sealed contact structure.

Surface barrier diodes utilizing the Schottky effect, based upon the rectification characteristic exhibited by a metal-to-semiconductor interface, are well known. Generally, the electrical characteristics of these diodes depend upon the work function of the metal as well as the electron affinity of the semiconductor material. Moreover, in common with other semiconductor devices, surface barrier diodes are susceptible to the contaminating effects of the ambient and therefore require similar encapsulation.

An object of this invention is an improved surface barrier diode having a desirable current-voltage characteristic.

Another object is a surface barrier diode in which the contact structure is inherently sealed from the ambient without additional encapsulation.

In one embodiment, this invention comprises a silicon semiconductor wafer having an oxide protected and masked surface on which a multilayer metal contact is constructed. In contact with the silicon surface and overlying the oxide coating is a first layer of an active metal such as chromium or titanium. On top of this sealing metal layer is a second layer of palladium or similar metal, and finally a heavy layer of gold or a dual layer of silver covered by gold is applied as the outer coating. Heat treatment of this structure results in a series of changes in electrical characteristics depending upon the temperature and time of such treatment. A most advantageous structure is achieved by heat treating at above 400 degrees centigrade for a period of about one-half hour. This treatment produces a solid state reaction between the palladium, which has penetrated the first layer of chromium or titanium, and results in the formation of a palladium silicide, which is the active contact layer producing the surface barrier with the semiconductor material. This structure exhibits a very sharp current-voltage characteristic in the reverse direction.

The invention and its objects and features will be more clearly understood from the following more detailed description taken in conjunction with the drawing in which.

Figure 1:
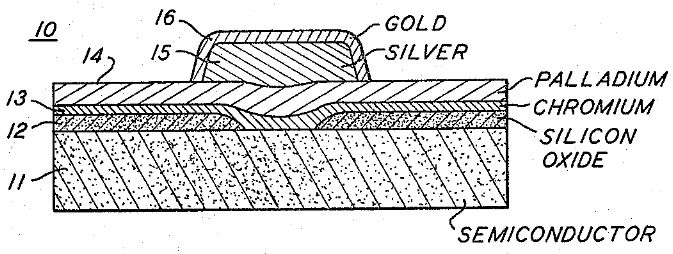
FIGS. 1 through 4 are cross sectional views of a surface barrier diode at successive intermediate steps of fabrication.

Referring to FIG. 1, the diode element 10 comprises a wafer 11 of silicon semiconductor material. Typically, this is single crystal silicon of low resistivity with a relatively thin high resistivity layer on the upper surface which has been produced by well-known epitaxial deposition techniques. In order to avoid undue complication of the drawing, the depiction of this epitaxial layer has been omitted. On this upper surface of the semiconductor wafer a coating 12 of silicon oxide is formed and a central opening made therein using conventional photoresist and etching techniques. Typically, the semiconductor wafer, including the epitaxial layer, has a thickness of about five mils. The hole in the oxide coating 12 is about one mil in diameter, and the silicon oxide coating is about 10,000 angstroms in thickness. As is known in the art, this oxide coating may be produced thermally or by deposition using evaporation or sputtering.

After removal of the photoresist coating, a chromium layer 13 is deposited over the surface of the wafer including the oxide coating and the exposed portion of the silicon wafer. Conveniently, this chromium may be deposited by evaporation or by cathodic sputtering and advantageously has a thickness of 300 to 500 angstroms. During this process, the substrate material is essentially unheated or at the most is at a temperature of 150 to 200 degrees centigrade. Next, a palladium layer 14 having a thickness of 5000 to 10,000 angstroms is deposited over the chromium film 13. Again, this deposition may be by evaporation or by the cathode sputtering technique.

Finally, using a photoresist mask to restrict its extent, a heavy layer 15 of silver of from one-half to one mil in thickness is plated over and slightly beyond the contact area. On top of the silver layer a thin outer coating 16 of gold is deposited. This dual layer 15–16 of silver and gold is a combination whose advantages are disclosed in Patent 3,028,663 to J. E. Iwersen and J. T. Nelson. In particular, the silver layer provides good adherence and conductivity and withstands higher temperature heat treatments while the outer layer of gold provides good means for making external contact.

Figure 2:
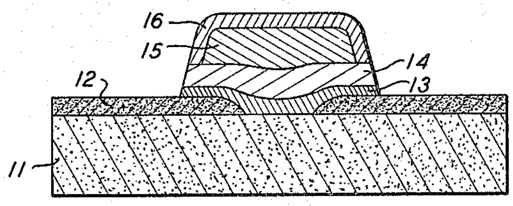

After the removal of any remaining photoresist material, the peripheral portions of the palladium and chromium layers 14 and 13, respectively, are removed to produce the structure illustrated in FIG. 2. The palladium is removed by electrolytic etching using nitric acid as the solution and the palladium to be etched as the cathode. The chromium outer layer may be removed by a straightforward chemical etching treatment in a hydrochloric acid solution.

Figure 3:
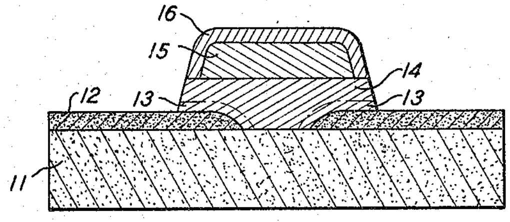
Figure 5:
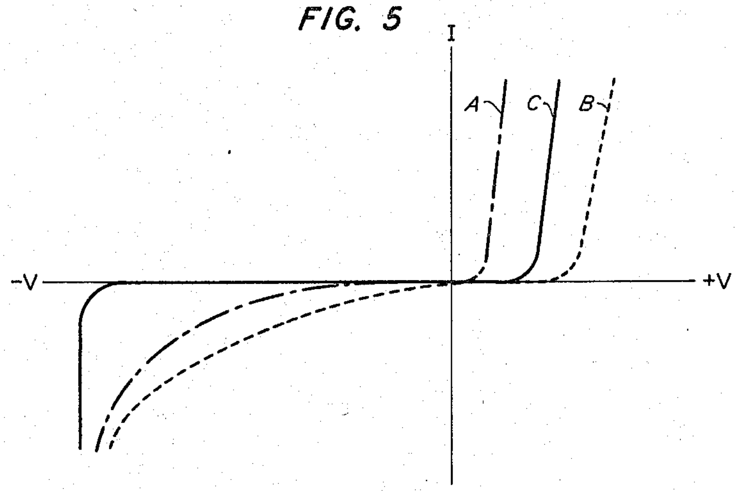
FIG. 5 is a graph of the current-voltage characteristics of the diode for three different modes of heat treatment.

The structure shown in FIG. 2 is a surface barrier diode in which the barrier is a chromium-silicon interface which generally exhibits a current-voltage characteristic of the type represented by curve A of FIG. 5. Heating the element of FIG. 2 at about 350 degrees centigrade for a period of about one-half hour results in an arrangement depicted in idealized form in FIG. 3. As represented in FIG. 3, the chromium layers 13 remain adherent in at least thin film form to the oxide coating as represented by the broken lines. This chromium-to-oxide seal provides the impervious arrangement which serves to protect the surface barrier contact from the effects of the ambient. The palladium layer 14 has penetrated through and largely dissipated the thin chromium layer previously in contact with the silicon semiconductor. Accordingly, the surface barrier is now a palladium-to-silicon interface which exhibits a current-voltage characteristic generally of the form represented by curve B of the graph of FIG. 5.

Figure 4:
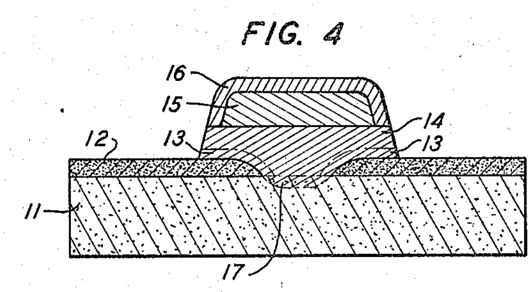

Finally, heat treatment at a higher temperature of 400 degrees centigrade or higher produces a further change in the diode structure as shown in FIG. 4. There the chrome-to-oxide films 13 still remain in place to render protection. The higher temperature treatment produces a palladium and silicon solid state reaction producing a thin layer of a palladium silicide 17. This intermetallic layer now forms the surface barrier with the semiconductor material. The electrical characteristics of this surface barrier junction are of the form depicted by curve C of FIG. 5. In particular, the final structure of FIG. 4 results in a highly useful reverse characteristic rendering the diode particularly useful for applications in logic circuits and the like.

It will be understood that the diodes of FIGS. 2, 3 and 4 are completed by applying leads or contacts to the gold layer 15 on one side and to a plated metal contact applied to the bottom surface of the wafer 11. As previously mentioned, in addition to the use of chromium as the first or sealing metal layer, titanium, zirconium and vanadium may also be used. Either of these so-called active metals will provide the highly desirable metal-to-oxide seal which renders this device self-protective.

There are also other metals which may usefully be applied as the second metal layer in lieu of palladium. Specifically, nickel, copper, rhodium, platinum, tungsten and molybdenum may be so used. A particularly useful arrangement is one in which in place of the limited area layers 15–16 of silver and gold, an additional layer of the same metal as that used in the second layer is deposited. In particular, if the second layer is palladium, then a heavy palladium layer 15 may be deposited thereover. Double layers of copper have also been found advantageous. In all of the proposed structures, an important consideration is the heat treatment of the assembly and its effect on intermixing of the several different metal layers. In all cases, a thin outer coating of gold may be deposited to function as an etching mask and to facilitate connection of external leads.

In connection with the fabrication of the device disclosed herein, the word "deposition" will be understood to have a broad meaning covering the techniques of evaporation and sputtering as may be most appropriate in accordance with the teaching of the art. The electrical characteristics shown in the graph of FIG. 5 are specific to the particular combination of metals disclosed, namely, chromium and palladium, and it will be understood that other metal combinations may produce different responses in the forward direction. However, all of the arrangements disclosed involve ultimately the formation of a silicide compound which provides the sharp reverse characteristic described and shown in FIG. 5. Furthermore, the formation of such compounds by solid reaction occurs also in gallium arsenide to produce the same type of improved electrical characteristic.

Figure 6:
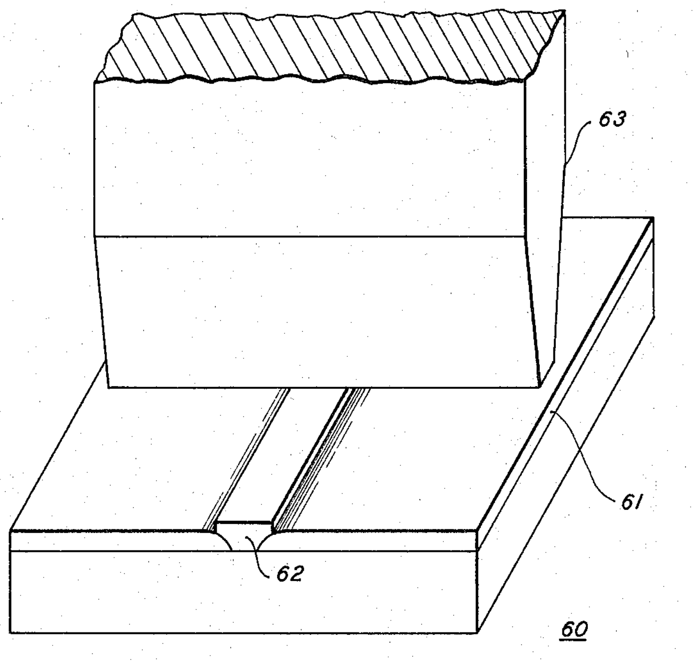
FIG. 6 is a perspective view of one form of diode in accordance with this invention and the advantageous contact arrangement.

The self-sealing arrangement of this invention is particularly advantageous from the standpoint of the geometry of the contact which may be realized by the device designer. In particular, it is generally advantageous to increase the peripheral dimension of the contact in order to decrease the series resistance of the device. However, it has been necessary in previous devices to reduce the periphery in order to reduce the problems of edge leakage. However, inasmuch as in accordance with this invention the edges of the contact structure are now effectively sealed from contamination and leakage, optimum geometries may be utilized. For example, in the illustration of FIG. 6, the diode element 60 has a coating 61 of silicon oxide over most of its active surface. The metal contact structure 62 has the configuration shown which facilitates contacting with the large wedge-shaped metal contact member 63. This arrangement reduces alignment problems in assembling and materially reduces the inductance of the device structure. The usefulness of this arrangement for high frequency devices may be appreciated by realization that the width of the contact 62 at the surface of the semiconductor wafer may be about two microns and its width at its upper surface may be three to four microns.

Although the invention has been described in terms of a particular embodiment, it will be appreciated that other arrangements may be devised by those skilled in the art which also will fall within the scope and spirit of the invention.

What is claimed is:

1. A surface barrier diode comprising a wafer of silicon semiconductor material, a thin layer of relatively small extent of a metal silicide in surface barrier relation on one surface of said silicon wafer, said metal being one selected from the group consisting of palladium, nickel, copper, rhodium, platinum, tungsten and molybdenum, a layer of silicon dioxide on the balance of said one surface of said wafer, a film of a sealing metal selected from the group consisting of chromium, titanium, vanadium and zirconium overlying at least the peripheral portions of said oxide coating adjoining said contact layer, and a layer of said metal overlying said contact area and said sealing metal area.

2. A surface barrier diode comprising a wafer of single crystal silicon, a coating of silicon dioxide on one major surface of said wafer, said coating having a small opening therethrough, a layer of a metal silicide within said opening in surface barrier contact with said silicon wafer, said metal being one selected from the group consisting of palladium, nickel, copper, rhodium, platinum, tungsten and molybdenum, a thin layer of chromium overlying the peripheral portions of said oxide coating adjoining said contact, and a layer of said metal overlying said contact and said chromium layer.

3. A device in accordance with claim 2 in which said metal layer is covered by a relatively heavy double layer of silver and gold.

4. A surface barrier diode comprising a wafer of single crystal silicon, a coating of silicon dioxide on one major surface of said wafer, said coating having a small opening therethrough, a layer of palladium silicide within said opening in surface barrier contact with said silicon wafer, a thin layer of chromium overlying the peripheral portions of said oxide coating adjoining said contact, and a layer of palladium overlying said contact and said chromium layer.

5. A surface barrier diode comprising a wafer of silicon semiconductor material having a silicon dioxide coating over one major surface thereof, said coating having a small opening therethrough to expose the semiconductor wafer surface, a thin layer of chromium overlying at least the peripheral portions of said oxide coating adjoining said opening, and a layer essentially of palladium overlying said opening and in surface barrier contact with said silicon and overlying said chromium layer.

6. A surface barrier diode comprising a wafer of silicon semiconductor material, a coating of silicon dioxide on one major surface of said wafer, said coating having a small opening therethrough, a thin layer of chromium overlying said opening and the adjoining peripheral portions of said silicon dioxide coating, said chromium being in surface barrier contact with said silicon wafer, a relatively thicker layer of palladium overlying said chromium layer, and a thick outer layer of silver and gold overlying said palladium layer.

7. In the method of fabricating a surface barrier diode the steps of forming an oxide coating on one major surface of a silicon semiconductor wafer, opening a hole through said coating to expose a portion of said wafer surface, depositing a thin layer of a first metal selected from the group consisting of chromium, titanium, vanadium and zirconium on said oxide coating and said exposed wafer portion, depositing a second metal selected from the group consisting of palladium, nickel, copper, rhodium, platinum, tungsten and molybdenum on top of said first metal layer, depositing a third metal layer on top of said second layer over an area slightly greater than the area of said contact through said oxide coating, removing the peripheral portions of said first and second metal layers not covered by said third layer, and heating said element to enhance its current-voltage characteristic.

8. The method in accordance with claim 7 in which said third metal layer comprises a thick layer of silver covered by a thin outer layer of gold.

9. In the method of fabricating a surface barrier diode the steps of forming an oxide coating on one major surface of a silicon semiconductor wafer, opening a hole through said coating to expose a portion of said wafer surface, depositing a thin layer of chromium on said oxide coating and said exposed wafer portion, depositing a layer of palladium on top of said chromium layer, depositing a thick layer of silver on top of said palladium layer over an area slightly greater than the area of said contact through said oxide coating, removing the peripheral portions of said palladium and said chromium layers not covered by said silver layer, and heating said element to enhance its current-voltage characteristic.

10. The method in accordance with claim 9 in which the heat treatment is carried out at about 350 degrees centigrade for about one-half hour to produce a palladium-to-silicon surface barrier device.

11. The method in accordance with claim 9 in which said heat treatment is carried out at about 400 degrees centigrade for a period in excess of one-half hour to produce a palladium silicide-to-silicon surface barrier device.

References Cited by the Examiner

UNITED STATES PATENTS

| | | | |
|---|---|---|---|
| 2,973,466 | 2/1961 | Attala | 317—240 |
| 3,065,391 | 11/1962 | Hall | 148—333 |
| 3,158,788 | 11/1964 | Last | 317—101 |
| 3,178,270 | 4/1965 | Byrnes | 29—183.5 |
| 3,200,310 | 8/1965 | Carman | 317—234.5 |
| 3,231,421 | 1/1966 | Schmitt | 317—234.5 |

HYLAND BIZOT, *Primary Examiner.*